United States Patent [19]

Grüning

[11] Patent Number: 5,493,247
[45] Date of Patent: * Feb. 20, 1996

[54] GATE CIRCUIT FOR HARD DRIVEN GTO

[75] Inventor: Horst Grüning, Wettingen, Switzerland

[73] Assignee: Asea Brown Boveri Ltd., Baden, Switzerland

[*] Notice: The portion of the term of this patent subsequent to Aug. 17, 2010, has been disclaimed.

[21] Appl. No.: 39,398

[22] PCT Filed: Oct. 30, 1992

[86] PCT No.: PCT/CH92/00222

§ 371 Date: Apr. 28, 1993

§ 102(e) Date: Apr. 28, 1993

[87] PCT Pub. No.: WO93/09600

PCT Pub. Date: May 5, 1993

[30] Foreign Application Priority Data

Nov. 2, 1991 [DE] Germany ............... 41 36 181.4

[51] Int. Cl.⁶ ................................................. H03K 17/56
[52] U.S. Cl. ................... 327/440; 327/443; 327/330; 327/377; 327/380
[58] Field of Search ................................ 307/633, 305, 307/263, 632, 634, 630

[56] References Cited

U.S. PATENT DOCUMENTS

| 3,943,430 | 3/1976 | Kumano | 302/633 |
|---|---|---|---|
| 4,568,837 | 2/1986 | Seki | 307/633 |
| 5,077,487 | 12/1991 | Iida | 307/633 |
| 5,237,225 | 8/1993 | Grüning | 307/633 |

FOREIGN PATENT DOCUMENTS

| 0328778 | 8/1989 | European Pat. Off. . | |
|---|---|---|---|
| 3617185 | 11/1987 | Germany | 307/633 |
| 0281068 | 7/1990 | Germany | 307/633 |
| 4012843 | 10/1991 | Germany . | |
| 0639561 | 3/1979 | Japan | 307/633 |
| 91/04608 | 4/1991 | WIPO . | |

Primary Examiner—Timothy P. Callahan
Assistant Examiner—Dinh Le
Attorney, Agent, or Firm—Oblon, Spivak, McClelland, Maier & Neustadt

[57] ABSTRACT

In a circuit for hard driving a GTO, the conductor inductance (L1) and the internal inductance of the GTO (L2) form, together with a first capacitor (C1) situated in parallel via a switch (S), a series resonance circuit inside the gate circuit. In this connection, the chosen sizes of the first capacitor (C1) and of the first inductance (L1) are such that, if the first capacitor (C1) discharges via the two inductances (L1, L2), the gate current originating from the first capacitor (C1) exceeds half the value of a GTO anode current to be turned off within less than 5 μs in the first quarter cycle of the series oscillatory circuit. Moreover, first means are provided which uncouple the first capacitor (C1) from the generation of the gate current after the first quarter cycle of the resonance circuit and allows the gate current to decay slowly in such a way that, at any time, it is greater than the tail current of the GTO. Finally, second means are provided in the form of a recharging circuit, which means are activated during the decay of the gate current and apply a holding current ($V_H$) which is sufficient for blocking the gate (G) of the GTO after the decay of the gate current.

7 Claims, 6 Drawing Sheets

GATE CIRCUIT FOR HARD DRIVEN GTO

BACKGROUND OF THE INVENTION

1. Field of the Invention

The present invention relates to the field of power electronics. It concerns a GTO thyristor circuit comprising:

(a) a gate turn-off thyristor GTO having an anode, a cathode and a gate;

(b) a drive circuit which is connected between gate and cathode of the GTO and which, together with the GTO, forms a gate circuit and is provided for turning the GTO on and off; and (c) a first inductance and a second inductance inside the gate circuit, the first inductance representing the inductance of the conductors and components in the drive circuit and the second inductance the internal inductance of the GTO itself.

Such a is circuit disclosed, for example, in EP-A3-0 228 226.

2. Discussion of Background

At present a multiplicity comprising about 190 types of GTO is available on the market. In application, they essentially divide into three important fields of use, namely traction (for example, in electric locomotives), the UPS (uninterruptible mower system) and industrial drives. This widespread use has taken place even though the GTO is subject to a few problems for the user, particularly from the point of view of circuit engineering. An improvement in the GTO itself or a simplification of its external circuit therefore has an enormous economic significance.

In connection with the GTO, the user sees himself confronted, in particular, with the following problem areas:

complexity in the driving system;

turn-off failures;

spike voltage control;

switching losses in the GTO and in the circuit;

cooling.

Turn-off thyristors (GTOs) had, hitherto to be operated with appreciable circuit networks comprising diodes, inductances and capacitors (snubbers) in order to reliably avoid critical states in the component. Apart from additional weight, increased volume and appreciable losses, this entails, in particular, additional development and manufacturing costs. The development of control software is markedly more expensive as a result of the complicated mode of operation engendered by the snubbers. Attempts are therefore being made to reduce the size of the snubbers (smaller inductances and smaller capacitors) and to simplify them.

In this connection, an important role is played, in particular, by the leakage inductance of the arrangement and the snubber diode. To reduce surge voltages due to inductances, an appreciable design complexity has to be adopted. More recently, very special diodes have also been developed for these applications.

The reason for the snubbers required is generally recognized to consist in the inhomogeneous turning-on and turning-off of GTOs: a multiplicity of studies using infrared, thermal and induction measurements have repeatedly emphasized this state of affairs. The efforts have, therefore, been directed to the production of components which are as homogeneous as possible (in particular, in relation to the doping). Despite striking improvements in the doping homogeneity, it has not been possible, however, to simplify the snubbers substantially or to reduce them in size.

The declared objective of users and manufacturers is a rapidly switchable HF-GTO. This should be notable, inter alia, for a markedly smaller circuit complexity, and for low driving power and few turn-off failures. To provide such an HF-GTO, the earlier European Application No. 90123659.6 by the same inventor of the present invention has already proposed a hard driving switching arrangement, in which the turn-off is effected by a pulse-type gate current which rapidly exceeds (in a few µs) the anode current.

FIG. 3 in the earlier application diagrammatically shows a suitable gate circuit for a GTO of known design. In that case, the gate circuit comprised a relatively low gate circuit inductance LG between a switch GU and the gate terminal of the GTO component;

a first high-voltage capacitor CR1 between the switch GU and the cathode terminal of the GTO;

a second, lower-voltage capacitor CE1 in parallel with the first capacitor CR1 and a diode D1 upstream of CE1 for isolating the capacitor voltages.

At the same time, the gate circuit inductance is set by the inductance which is unavoidable in conventional housing designs. The circuit functions in a quasi-resonant operating mode: the small first high-voltage (preferably ≧100 V, for example 200 V) capacitor CR1 initially supplies a gate current which rapidly increases despite the gate circuit inductance present and which, after the discharging of the second capacitor (the maintenance capacitor) CE1 is maintained for a fairly long time (duration of the turn-off process). The capacitor CR1 is rated (allowing for the actual inductance in the GTO housing) so that, after discharge, it has built up a gate current which corresponds to the maximum turn-off anode current. The relatively long-persisting current from CE1 has to be provided at a voltage which is below the avalanche of the gate/cathode section (15 25 V).

In this way, a gate current is provided which is sufficiently high and fast for the cathode current to be less than zero under all circumstances. The fairly long-persisting low voltage is able to prevent the gate current collapsing during switching and the component entering a critical state.

Figure 1A:
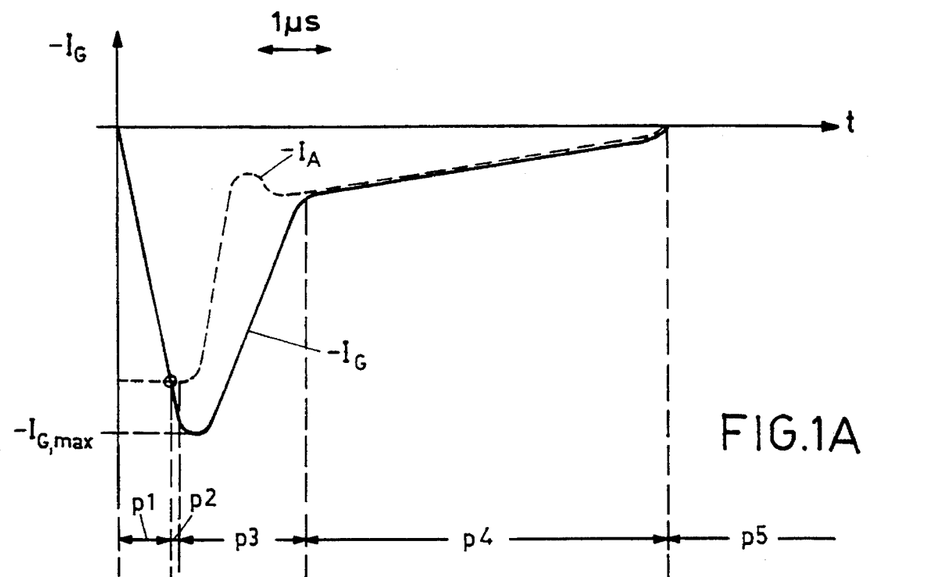
FIG. 1A,B shows the desired diagrammatic variation of anode current, gate current and gate voltage with time in the case of the hard turn-off of a GTO.
Figure 1B:
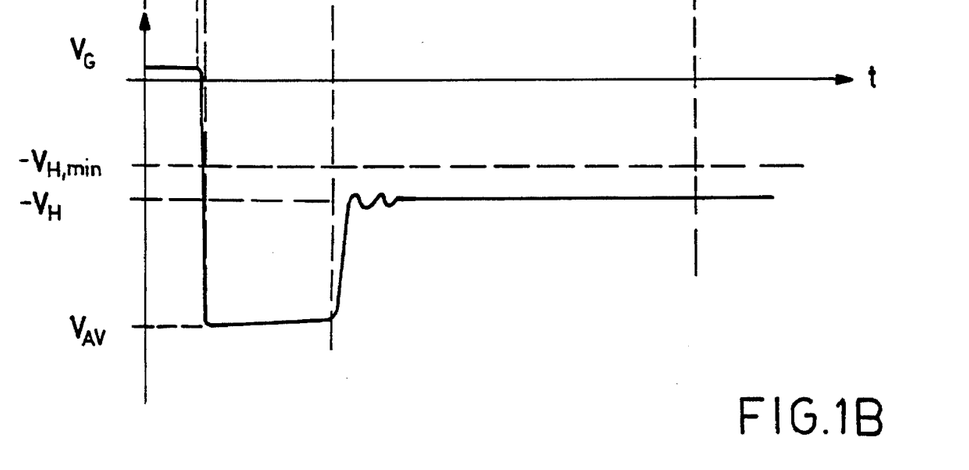

Although a gate circuit suitable for hard driving has consequently already been provided in principle in the earlier application, the means by which the critical transition of this circuit from the depletion mode (extraction of the charge carriers from the gate/cathode section) to the static holding mode is not disclosed. In order to make the set objective clear, the boundary conditions for a hard-driven HF-GTO or HD (hard-driven)GTO will first be defined more precisely below:

For ideal turn-off, the gate current $I_G$ should rise rapidly in a first phase p1 (FIGS. 1A and 1B) until it exceeds the anode current $I_A$ in a second phase p2 and consequently reverses the cathode current (not shown in the Figure). Once the cathode current has changed its polarity, the plasma in the gate/cathode section is extracted in a third phase p3 and the associated pn junction (gate voltage $V_G$) acquires the avalanche voltage $V_{AV}$. The gate voltage $V_G$ maintains the avalanche voltage $V_{AV}$ as long as the gate current $I_G$ is greater than the anode current $I_A$ (tail current) and then has to be restored to a lower value, sufficient for blocking, in such a way that the internal gate voltage never falls below a critical limit (the minimum holding voltage $V_{H,min}$) in a fourth phase p4. This has to be followed by a fifth phase p5, the holding phase, during which the gate voltage is held at an off potential (holding voltage $V_H$).

In principle it would, therefore be sufficient if the gate voltage at the silicon wafer of the GTO (internal gate voltage) were already set to the second value, the holding voltage $V_H$, which is sufficient for blocking after completion of the depletion process. The third phase p3 could then be eliminated and the energy consumption of the gate circuit would be reduced to a necessary minimum. For this purpose, however, a voltage control would be necessary instead of the current control, i.e. the direct control of the internal gate voltage by a suitably stable voltage source. In the case of a GTO in a standard housing, however, this is impossible because of the conductor inductance since, instead of the actual 30 nH 50 nH, a gate circuit inductance of not more than 1 nH would have to be achieved (dI/dt>5 kA/µs, equivalent to 5 V across 1 nH, has been measured).

Figure 2:
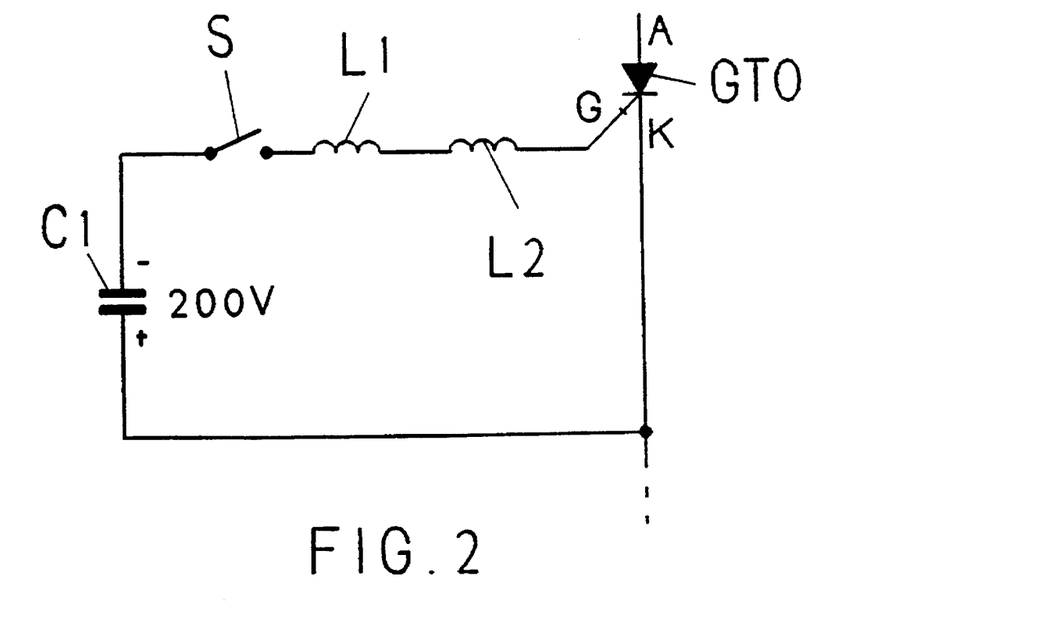
FIG. 2 shows the circuit diagram for the resonant generation of a gate current pulse for the hard turn-off of a GTO.

In the case of the GTO drive, the conditions are consequently different: during the first phase p1, current control has to take place since, to achieve a dI/dt>2 kA/µs (3 kA GTO; turn-off condition reached after 1 µs) a much greater voltage is necessary, as already mentioned, than the holding voltage $V_H$ in the fourth phase p4 (typically 15 V). As already disclosed in the earlier application mentioned, the energy for this purpose is most easily derived, in accordance with FIG. 2, from a capacitor discharge. For this purpose, a first capacitor C1 is connected to gate G and cathode K of the GTO via a switch S, the lead inductance L1 and the internal inductance L2 of the GTO.

Figure 3:
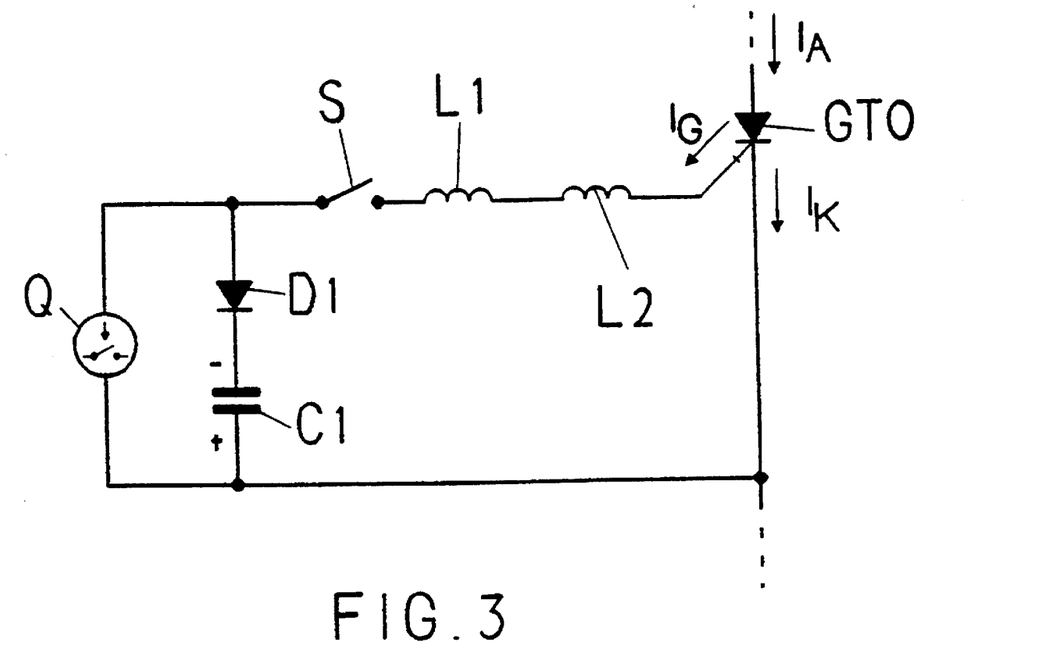
FIG. 3 shows the circuit diagram of a possible transition from the current control according to FIG. 2 in the depletion phase to voltage control in the holding phase by uncoupling the first capacitor.

However, before the current in the resultant oscillatory circuit (comprising the first capacitor C1, the conductor inductance L1 and the internal inductance L2) reverses after the first half-cycle, the first capacitor C1 has to be uncoupled. This could be done, for example, by means of a diode D1 (FIG. 3) which is connected in series with the first capacitor C1. C1 is then recharged and the current is interrupted after passing through the diode recovery stage (caution: current reversed for a short time). In this case, an additional source Q must already be brought into the circuit before the current drops below the tail current so that the internal gate voltage on the GTO does not collapse for a short time. A complicated timing control and a further low-inductance circuit would be necessary without the problem of the transition to the subsequent holding state being solved.

Figure 4:
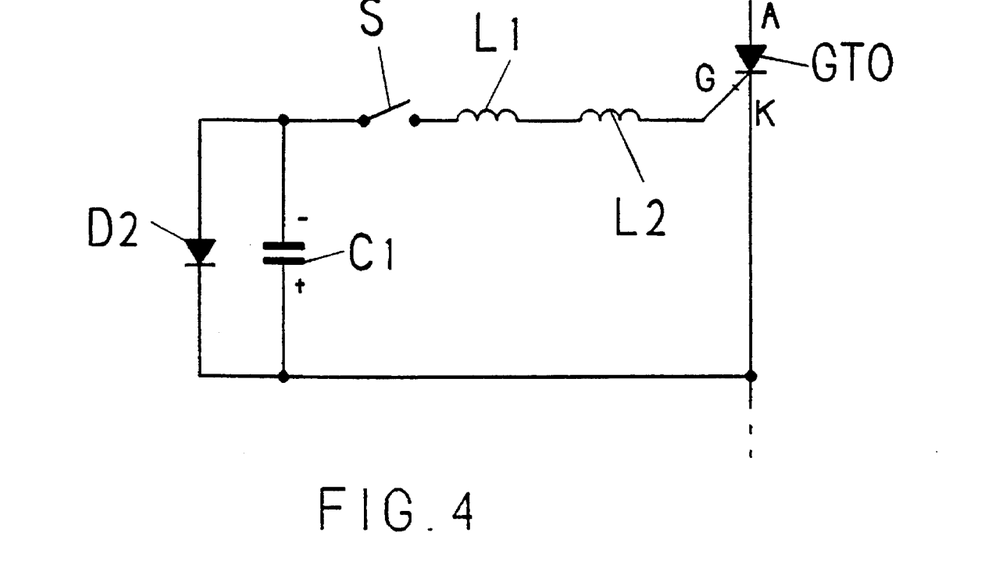
FIG. 4 shows a type of uncoupling of the first capacitor which is an alternative to FIG. 3.

It would therefore be better to carry out the uncoupling at the very instant when the current maximum (the maximum gate current $I_{G,max}$ in FIG. 1A) (capacitor voltage 0) is being traversed. For this purpose, for example, the first diode D2 is connected in parallel with the first capacitor C1 in accordance with FIG. 4. Only the internal gate voltage and the losses in the switch S, in the first diode D2 and in the gate circuit then add to form the back-e.m.f. across the circuit inductance (L1+L2), i.e. the gate current $I_G$ generally decreases markedly more slowly than it rose (phase p3 in FIG. 1A). This ensures that the gate current $I_G$ during the drop-off phase (anode current $I_A$ drops back to the tail current value) is greater than the anode current $I_A$.

Nevertheless, it would not be easy even then to define the correct instant for switching on a holding current source (current drops below the anode current $I_A$). And, because dI/dt is still high, this source would also have to be current-controlled and the transition to the ultimate voltage control in the holding phase p4 would only be postponed.

SUMMARY OF THE INVENTION

Accordingly, one object of the invention is to provide a novel gate circuit for hard driving a GTO which makes possible, during the turn-off process, the transition from current control to voltage control without parasitic inductances and recovery processes having a disturbing influence.

The object is achieved in a device of the type mentioned at the outset, wherein (d) a first capacitor which is connected to the gate and cathode of the GTO via a switch situated in series is provided in the gate circuit and forms, together with the first and second inductance, a series oscillatory circuit;

(e) the chosen sizes of the first capacitor and of the first inductance are such that, if the first capacitor discharges via the two inductances, the gate current originating from the first capacitor exceeds half the value of a GTO anode current to be turned off within less than 5 µs in the first quarter oscillation of the series oscillatory circuit;

(f) first means are provided which uncouple the first capacitor from the generation of the gate current after the first quarter oscillation of the series oscillatory circuit and allows the gate current to decay slowly in such a way that, at any time, it is greater than the tail current of the GTO; and (g) second means are provided which are activated during the decay of the gate current and apply a holding voltage which is sufficient for blocking to the gate of the GTO after the decay of the gate current.

The core of the invention is to provide a hard GTO drive in which a transition is made from an initial current control to a subsequent voltage control if the parasitic effects are already biased by a current.

A first preferred embodiment of the invention is distinguished by the fact that the first means comprises a first diode connected in parallel with the first capacitor.

According to a second preferred embodiment, the second means comprises a series circuit composed of a second capacitor and a second diode, which series circuit is connected in parallel with the first capacitor.

Further embodiments emerge from the dependent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 5:
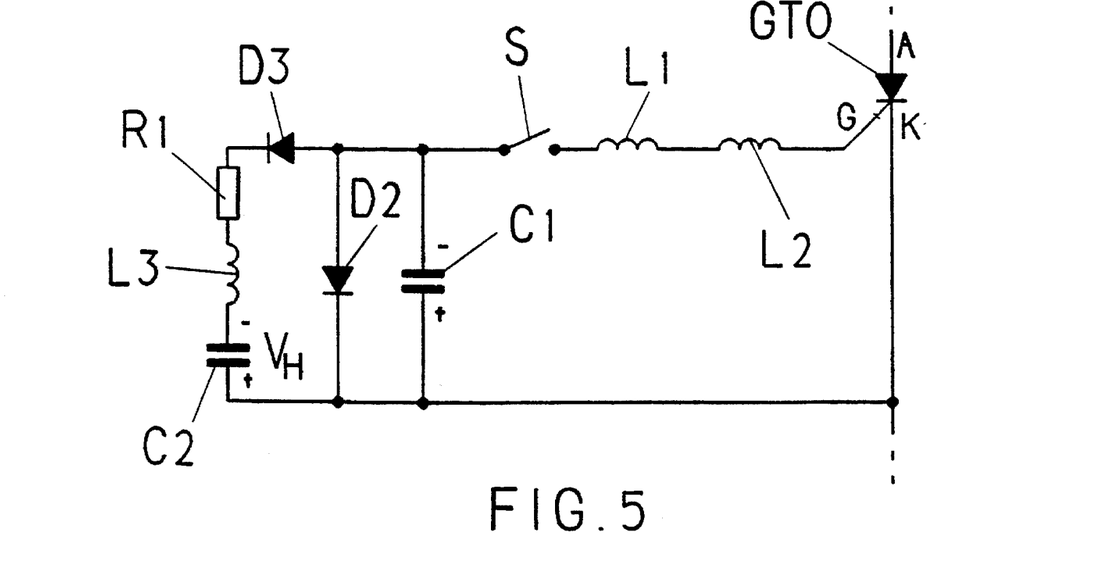
FIG. 5 shows a first exemplary embodiment of a GTO drive according to the invention.

Referring now to the drawings, wherein like reference numerals designate identical or corresponding parts throughout the several views, while FIGS. 1 to 4 have already been explained in the introduction in connection with the objective underlying this invention, FIG. 5 shows a first preferred exemplary embodiment of a GTO thyristor circuit according to the invention.

Here the central component is again a GTO having anode A, cathode K and gate G which is driven by a gate circuit. The gate circuit contains, as already described in connection with FIG. 4, the two inductances L1 (conductor inductance) and L2 (internal inductance of the GTO), the first capacitor C1 situated in series via a switch S and the first diode D2, which is parallel thereto. The chosen value (or size) of the first capacitor C1 and the first inductance L1 are such that, if the first capacitor C1 discharges via the two inductances L1, L2, the gate current $I_G$ originating from the first capacitor C1 exceeds half the value of the GTO anode current $I_A$ to be turned off within less than 5 µs, preferably less than 2 µs in the first quarter oscillation of the series oscillatory circuit.

Connected in parallel with the first capacitor C1 is a recharging circuit composed of a second capacitor C2 (16 mF in the Example) pre-charged to the holding voltage $V_H$, a third inductance L3 (5 nH in the Example), a first resistor R1 (5 mΩ in the Example) and a second diode D3.

Figure 6A:
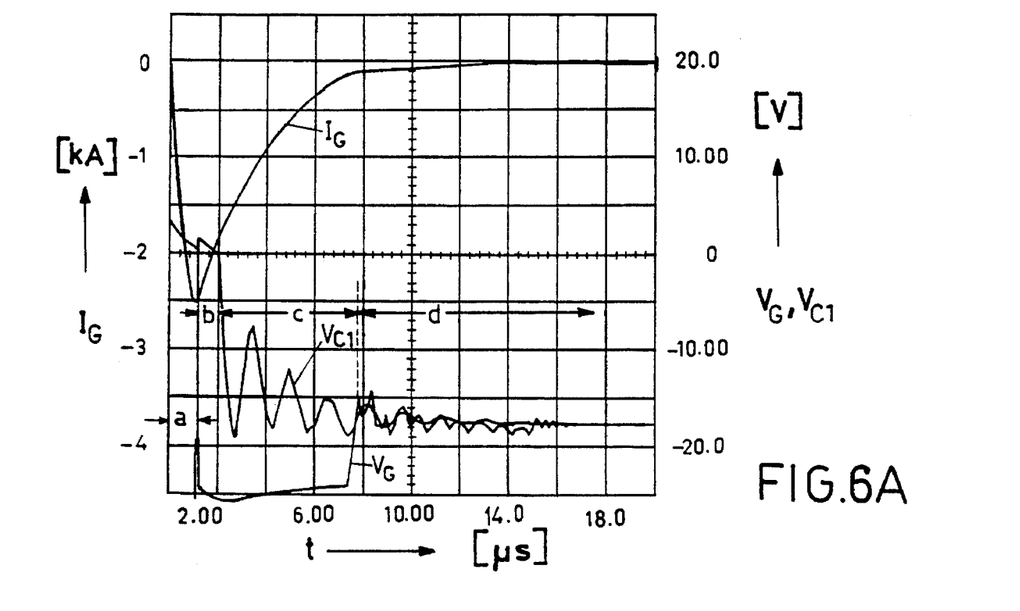
FIG. 6A shows simulation results for the variation of the gate current, the gate voltage and the voltage across the first capacitor with time for a circuit in accordance with FIG. 5.
Figure 6B:
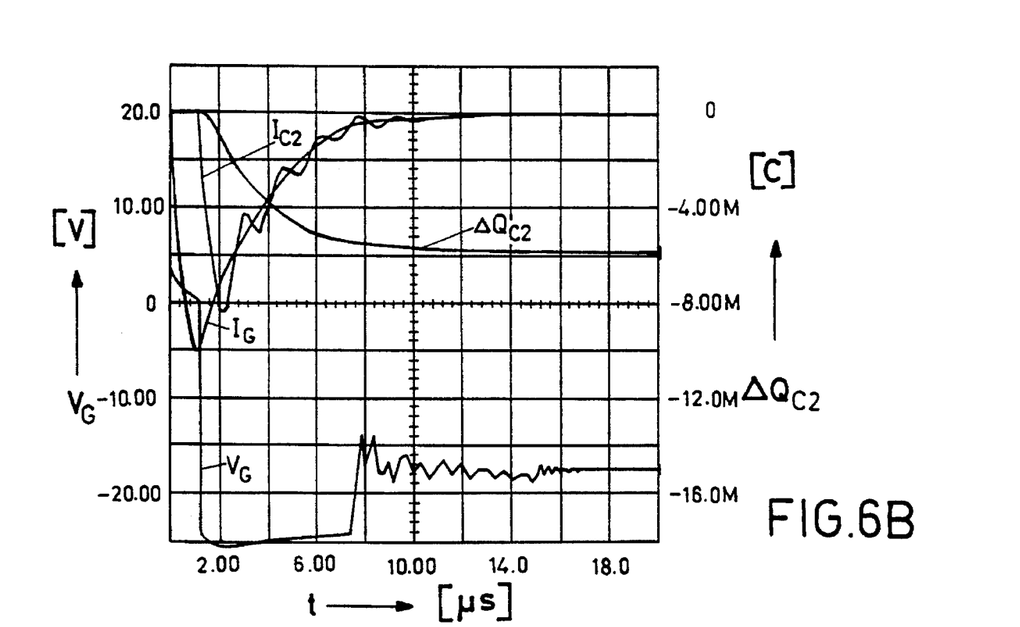
FIG. 6B shows simulation results for the variation of the gate current, the gate voltage and the current and charge change of the second capacitor with time for a circuit in accordance with FIG. 5.

The operation of the circuit can be explained by reference to FIGS. 6A and 6B, which show the variation with time of various currents, voltages and charges inside the circuit during various phases (a to d) of the turn-off process for the above-mentioned component values. Here $I_G$ and $V_G$ denote, as usual, the gate current and the gate voltage, respectively. $V_{C1}$ is the voltage across the first capacitor C1, and $I_{C2}$ and $DELTAQ_{C2}$ the current and the charge change, respectively, of the second capacitor C2.

In a first phase (a), the first capacitor C1 is discharged via the closed switch S and the inductances L1 and L2. During this process, the resultant gate current $I_G$ rises at the end of the first quarter period of the oscillation to its maximum value. The phases p1 and p2 in FIGS. 1A and 1B, therefore, fall into this time interval.

During the phase (b), the gate current is so large that the first capacitor C1 cannot be recharged. The voltage $V_{C1}$ therefore collapses to the forward voltage of the first diode D2. This is, however, the drive for building up the current in the recharging circuit (represented by the current $I_{C2}$). As soon as $I_{C2}$ is sufficiently large compared with $I_G$, the first capacitor C1 is charged (phase c). The internal gate voltage of the GTO continues to remain at the avalanche value as long as the gate current $I_G$ is greater than the anode current (tail current). The internal gate voltage then drops back to the holding value (phase d) and the cathode current (=anode current less gate current) falls to zero.

This critical transition at the beginning of phase (d) results in oscillations which are determined, on the one hand, by the interruption characteristic of the GTO and its parasitic gate capacitances and, on the other hand, by L1, L2 and C1. Not only the resistances in the gate circuit (for example, the internal resistance of the switch S) but also the resistances of the recharging circuit have a damping action in this case. Since R1 is particularly dominant here, this exemplary embodiment is particularly to be preferred, Moreover, the dimensioning of the recharging circuit is important: although the inception of the current $I_{C2}$ may be delayed and only has to have values slightly (for example, a factor 1.5) above the tail current, a small L3 and a R1 dimensioned as large as possible in accordance with the necessary current are necessary to damp vibrations between C2, L3, R1 and D3 (N.B. the diode D3 is forward biased and therefore continuously conducting) and C1 (the above-mentioned values are valid for a GTO designed for 3 kA and 4.5 kV). Such values are preferably achieved by connecting a plurality of subcircuits (L3=5 nH) in parallel and including the parasitic resistances in the capacitors (R1=5 mΩ results as the internal resistance with suitable choice of the capacitors as electrolytic capacitors). It can generally be stated that the value of R1 should be chosen so that a current supplied from the second capacitor C2, on the one hand, is less than the maximum gate current ($I_{G,max}$) and, on the other hand, is greater than the tail current of the GTO.

In addition, a particularly fast performance does not have to be required of the second diode D3: the forward recovery has an exclusively delaying action and consequently reduces even the charge ineffectively fed in from the recharging circuit in the phase (b). Preferably, use is made of slow diodes here—the extremely advantageous diode of type 1N4007 has proven most successful in the parallel circuit.

Figure 7:
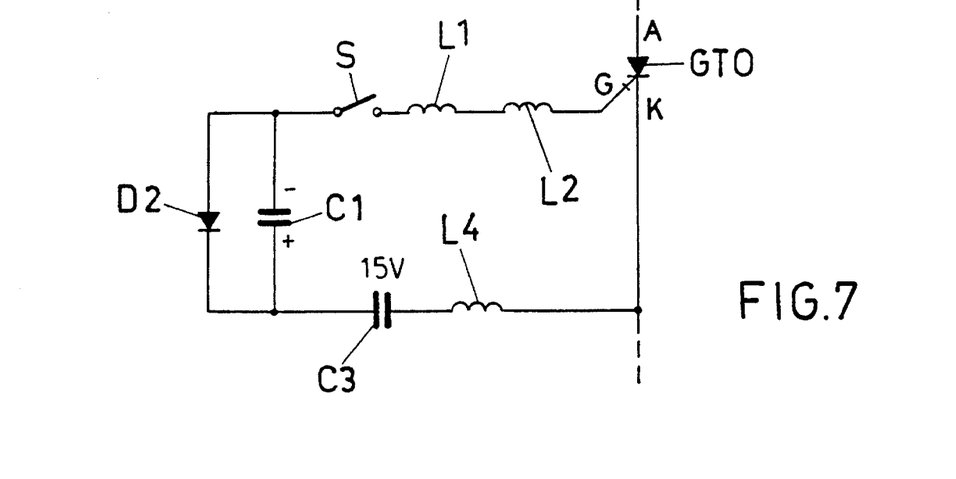
FIG. 7 shows a second exemplary embodiment for a GTO drive according to the invention.
Figure 8:
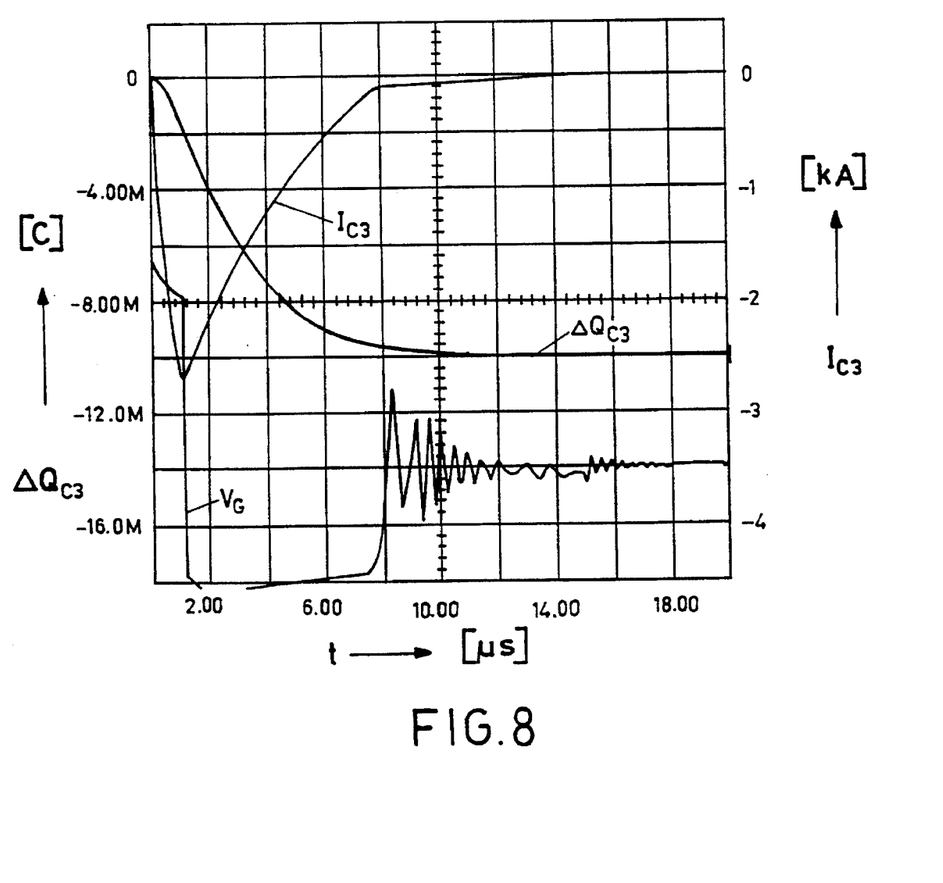
FIG. 8 shows a representation, analogous to FIG. 6B, for the circuit in accordance with FIG. 7.

A further exemplary embodiment of a gate circuit according to the invention is shown in FIG. 7. In this case, a third capacitor C3 (which is responsible for the holding voltage and is precharged to the holding voltage $V_H$) is connected in series with a fourth inductance L4, the first capacitor C1 used for the gate pulse. With this circuit, very similar characteristics are obtained to those obtained with the circuit in accordance with FIG. 5 (in this connection see the representation, equivalent to FIG. 6B, of the variation with time of the gate voltage $V_G$ and of the current $I_{C3}$ and the charge change $DELTAQ_{C3}$ of the third capacitor C3 in FIG. 8). However, the damping in this instance is not operative (higher oscillation amplitude in $V_G$ at the beginning of the phase d), and C3 has to supply more charge ($Q_{C3}$) and a higher pulse current ($I_{C3}$). The inductance L4 also now contributes directly to the inductance of the gate circuit, so that the spatial arrangement of the components is still more critical than in the circuit according to FIG. 5.

While only the turn-off phase has been dealt with in the previous designs, the overall sequence of states for the switching process of a GTO may be subdivided into four sections: (1) switching-on, (2) maintain on state, (3) turn-off, (4) maintain off state. In this connection, (1) and (2), and also (3) and (4) could in principle in each case be made to merge into one another. That is the same circuit as that described above could be used not only for turn-off, but also for maintaining the off state.

A direct consequence of this, however, would be that the associated pulse capacitors would remain discharged during that time. They could therefore be charged only during the on phase. This would result not only in a lengthening of this phase to the completion of the charging of the switch-off capacitors but also in a high charge current to accelerate the charging process. An additional impediment would be that the pulse capacitors would have to be isolated from the mains during the off phase so that an unnecessarily high current did not flow into a short circuit for a long time (the off time). Cost and benefit, therefore have an unfavorable ratio to one another in this type of operation.

A four-phase method having the above defined sequence of states (1) - (2) - (3) - (4) is, therefore proposed in which separate switches make the contact to the gate G of the GTO during each of the periods. The periods (1) and (3) can then be chosen to be short (typically 10–30 µs). During the periods (2) and (4) only a small holding current flows (a few A in (2) so that, as is known, turning-off of the GTO is prevented, and a small mA leakage current occurs in state (4)). The pulse capacitors are then recharged virtually during the entire cycle time (=1/f–(10–30 µs)). Especially in the case of the large turn-off capacitor (capacitor C1; typically 200 V, 20 µF for a GTO designed for 3 kA and 4.5 kV), it is preferable to use a chopper in order to save energy.

Especially in the case of the large GTOs designed for typically 3 kA and 4.5 kV use (mainly considered here), correspondingly large gate currents are necessary during turn-off. In this case, thyristors could in principle be used as switches S in the gate circuit. However, because of their immanent plasma propagation, these switches are comparatively slow. They, therefore, contribute not only to an undesirable limitation of the current slope dI/dt in the gate G of the GTO, but they also cause increased losses in the gate unit.

The following variants, in particular, are therefore proposed for the switch S in FIGS. 5 and 7:

(a) a parallel circuit comprising MOSFETs

The speed is very good. However, the cost is high (typical are values of only 100 A/MOSFET) and the parallel circuit is quite troublesome because of the source-wire inductances (transients may be produced across these inductances (N.B. 4 kA/µs×10 nH=40 V) which result in the MOSFETs being endangered or destroyed).

(b) a parallel circuit comprising IGBTs:

The problems here are similar to those in the case of the MOSFETs, but 3–4 times fewer components are required since the current carrying capacity is greater because of the charge carrier injection and the losses are less. Attention must, therefore, be paid to an optimum conductor track routing and decoupling of the gates (resitances).

(c) finely structured thyristor or GTO with hard turn-on control:

Just as in the main circuit, the dI/dt>a few kA/µs required in the gate circuit can also be achieved by a hard turn-on of a GTO. In this connection, the fact that such a component has to have a reverse voltage of only about 500 V in the preferred embodiment has a beneficial effect. The center zone can therefore be of much thinner design (EPI) than in the case of the main GTO. This leads not only to a faster turn-on (less stored charge) but also much greater peak current densities (up to 1000 A/cm$^2$). This results in very small components having modest drive (<100 A for 3 kA in the case of the main GTO). For a low-inductance connection technique, a few low-voltage MOSFETs are sufficient for the drive.

(d) SITh, FCTh or the like

Obviously, field-controlled bipolar components may also be used for turning on the gate current. At least at present, however, there is still a lack of availability of such components.

The boundary conditions for the choice of the capacitors for C1 to C3 emerge from practical application. For GTOs designed for 3 kA and 4.5 kV, pulse currents of over 3 kA must be provided, the capacitors discharging in a time range of 1–3 µs (for dI/dt=3–1 kA/µs). The working voltage is in this case preferably approximately 200 V.

In principle, for example, pulse-current-resistant GTO snubber capacitors could therefore be used here, but costs and space requirements exceed any reasonable boundaries. The use of ceramic multilayer capacitors is therefore, preferably proposed. In addition, metallized polyethylene terephthalate film dielectric capacitors could be used if the working temperature is limited.

Figure 9:
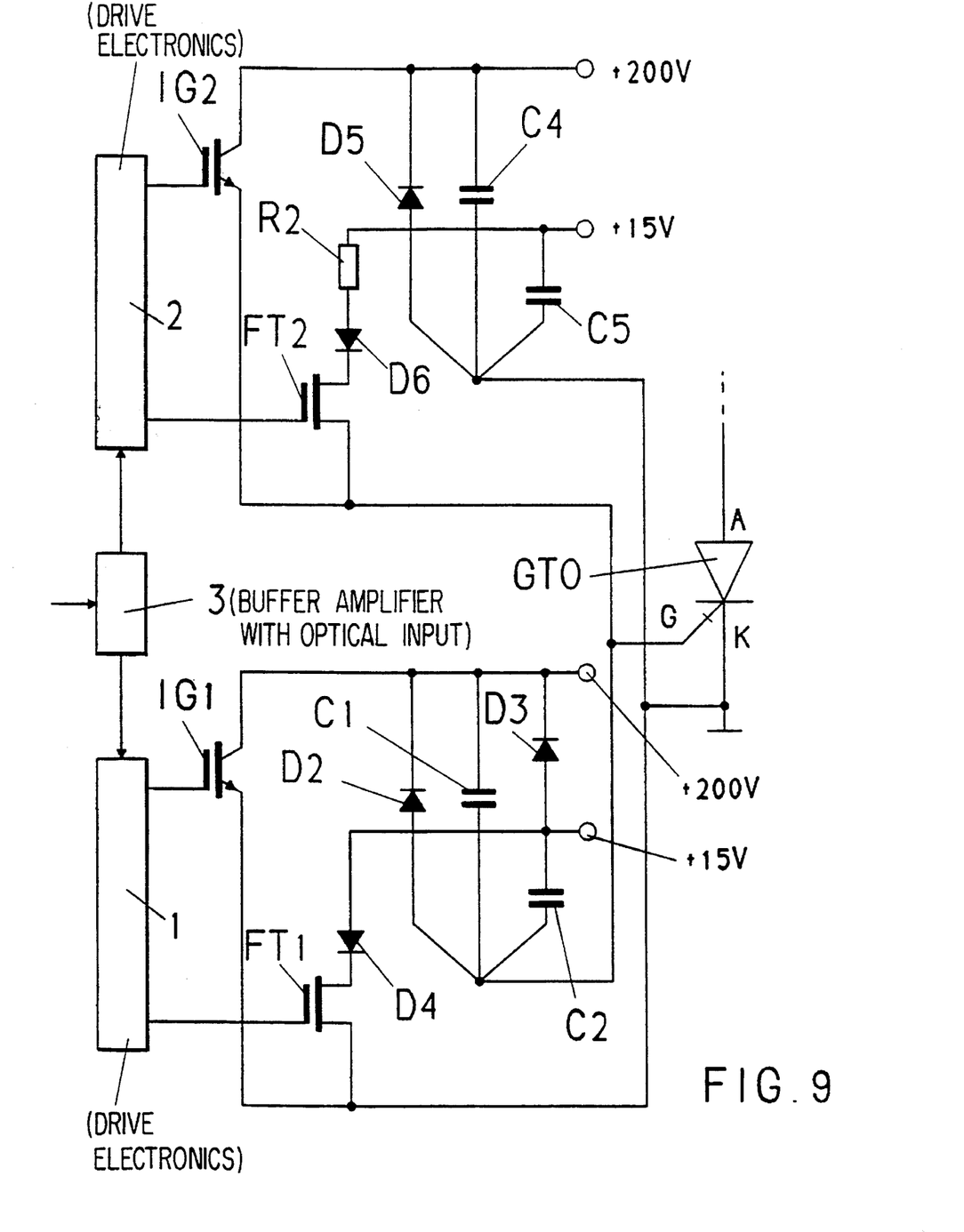
FIG. 9 shows an exemplary complete structure of a gate circuit according to the invention for switching-on and switching-off.

A preferred exemplary embodiment of the entire gate circuit of a GTO (turn-on and turn-off) is shown in FIG. 9. It comprises two largely similar circuit parts arranged in parallel for turn-off (lower part) and turn-on (upper part).

Both parts are driven by means of a buffer amplifier (having optical input) 3. The lower part (for turn-off) comprises a first drive electronics 1, a first IGBT IG1 as switch S, a first MOSFET FT1 as hold-off switch (with a third diode D4 in series) and the components C1, C2, D2, D3 already known from FIG. 5.

The upper part (for turn-on) comprises a second drive electronics 2, a second IGBT IG2, a second MOSFET FT2 as hold-on switch and corresponding components C4, C5, D5, D6 and a second resistor R2. All the components in the upper part can be chosen to have less load carrying capacity than the lower part since markedly lower currents are required for turn-on and holding in the turned-on state. In other respects, the operation of the upper part is largely identical to that of the lower part.

All in all, the invention results in a hard-driven GTO which is distinguished by a drastic reduction in the circuit complexity accompanied by a simultaneous reduction in the switching losses.

Obviously, numerous modifications and variations of the present invention are possible in light of the above teachings. It is therefore to be understood that, within the scope of the appended claims, the invention may be practiced otherwise than as specifically described herein.

I claim:

1. A GTO thyristor circuit comprising:

a gate turn-off thyristor (GTO) having an anode, a cathode and a gate;

a drive circuit connected between the gate and the cathode of the (GTO) for switching the (GTO) on and off by applying a gate current to the gate, said driving circuit having conductors and components defining a first inductance and said (GTO) thyristor defining a second inductance, the driving circuit further comprising:

a switch having a first end and a second end, the first end connected to the gate of the (GTO);

a first capacitor connected between the second end of the switch and the cathode and situated in series with the first and the second inductance forming a series resonant circuit;

first means disposed in parallel with said first capacitor, for uncoupling the first capacitor from the gate current after a first quarter cycle of the series resonant circuit and for allowing the gate current to decay slowly such that the gate current is greater than a tail current of the (GTO) at any time, the first means including a first diode having a cathode connected to the cathode of the (GTO); and second means, including a series circuit of a second capacitor and a second diode, disposed in parallel with said first capacitor, the second means applying a holding voltage sufficient for blocking the gate of the (GTO) after a decay of the gate current, wherein the second means is activated during the decay of the gate current.

2. The circuit as claimed in claim 1, wherein the second means additionally comprises:

a resistor connected in series with the second means whose value is chosen such that a current from the second capacitor is less than a maximum gate current and greater than a tail current of the (GTO).

3. The circuit as claimed in claim 1, wherein the second capacitor is precharged to the holding voltage during a turn-off state.

4. The circuit as claimed in one of claims 1, 2 and 3, wherein the first capacitor and the first inductance have values such that, if the first capacitor discharges through the first and the second inductances, the gate current originating from the first capacitor exceeds half of a (GTO) anode current value, and such that the (GTO) anode current is turned off within less than 5 µs in the first quarter cycle of the series resonant circuit.

5. The circuit as claimed in one of claims 1, 2 and 3, wherein the first capacitor and the first inductance have values such that, if the first capacitor discharges through the first and the second inductances, the gate current originating from the first capacitor exceeds half of a (GTO) anode current value, and such that the (GTO) anode current is turned off within less than 2 µs in the first quarter cycle of the series resonant circuit.

6. A GTO thyristor circuit comprising:

a gate turn-off thyristor (GTO) having an anode, a cathode and a gate;

a drive circuit connected between the gate and the cathode of the (GTO) for switching the (GTO) on and off by applying a gate current to the gate, said driving circuit having conductors and components defining a first inductance and said (GTO) thyristor defining a second inductance, the driving circuit further comprising;

a switch (S) having a first end and a second end, the first end connected to the gate of the (GTO);

a first capacitor (C1) connected between the second end of the switch and the cathode and situated in series with the first and the second inductance forming a series resonant circuit;

first means disposed in parallel with said first capacitor, for uncoupling the first capacitor from the gate current after a first quarter cycle of the series resonant circuit and for allowing the gate current to decay slowly such that the gate current is greater than a tail current of the (GTO) at any time, the first means including a first diode connected in parallel with the first capacitor and;

second means, including a second capacitor (C3) which is connected in series with the parallel circuit of the first capacitor and the first diode.

7. A circuit as claimed in claim 6, wherein the second capacitor (C3) is precharged to the holding voltage during a turn-off state.

* * * * *

UNITED STATES PATENT AND TRADEMARK OFFICE
CERTIFICATE OF CORRECTION

PATENT NO. : 5,493,247
DATED : February 20, 1996
INVENTOR(S) : Horst GRUENING

It is certified that error appears in the above-indentified patent and that said Letters Patent is hereby corrected as shown below:

On the title page, Item [87], the PCT Pub. Date is incorrect in the Letters Patent. It should read:

--[87] PCT Pub. No.: WO93/09600

PCT Pub. Date: May 13, 1993--

Signed and Sealed this

Twenty-first Day of May, 1996

Attest:

BRUCE LEHMAN

Attesting Officer     Commissioner of Patents and Trademarks